「United States Patent [19]
Nakamura

[11] Patent Number: 6,129,047
[45] Date of Patent: Oct. 10, 2000

[54] SUSCEPTOR FOR VAPOR-PHASE GROWTH APPARATUS

[75] Inventor: Osamu Nakamura, Imari, Japan

[73] Assignee: Sumitomo Metal Industries, Ltd., Osaka, Japan

[21] Appl. No.: 09/122,803

[22] Filed: Jul. 27, 1998

[51] Int. Cl.[7] .................................................. C23C 16/00
[52] U.S. Cl. ........................... 118/725; 118/728; 118/500
[58] Field of Search .................................... 118/725, 728, 118/500

[56]     References Cited

U.S. PATENT DOCUMENTS

| | | | |
|---|---|---|---|
| 3,845,738 | 11/1974 | Berkman et al. | 118/725 |
| 4,986,215 | 1/1991 | Yamada et al. | 118/728 |
| 4,990,374 | 2/1991 | Keeley et al. | 427/255.1 |
| 5,242,501 | 9/1993 | McDiarmid | 118/728 |
| 5,685,906 | 11/1997 | Dietze et al. | 117/101 |
| 5,685,914 | 11/1997 | Hills et al. | 118/723 E |
| 5,704,985 | 1/1998 | Kordina et al. | 118/725 |
| 6,043,460 | 3/2000 | Johnsgard et al. | 219/390 |

*Primary Examiner*—Jeffrie R Lund
*Attorney, Agent, or Firm*—Breiner & Breiner

[57]     ABSTRACT

It was an objective of the present invention to provide a susceptor which can prevent a increasing phenomenon of the dopant concentration of the epitaxial layer at the peripheral portion of the wafer. By providing a through-hole 7 passing through to a rear side at the outer peripheral side of the wafer inside the wafer pocket 6, a down flow of a reacting source gas from the upper surface of the susceptor 5 is formed, so that the unwanted flow of the dopant species being exhausted at the rear surface onto the wafer surface can be avoided. As a result, a raise in the dopant concentration at the outer peripheral portion of the epitaxial layer 9 can be controlled.

2 Claims, 3 Drawing Sheets

SUSCEPTOR FOR VAPOR-PHASE GROWTH APPARATUS

BACKGROUND OF THE INVENTION

1. Field of the Invention

The present invention relates to an improvement of a susceptor which is employed to a vapor-phase growth apparatus to grow an epitaxial film onto the semiconductor wafer. More specifically, the present invention relates directly to a vapor-phase growth apparatus in which a through-hole portion extending to a rear side of the susceptor is provided at the most outer peripheral portion inside the wafer pocket in order to mount the wafer, and a raise in dopant concentration at the outer periphery of the grown epitaxial film can be controlled.

2. Description of the Prior Art

As to a vapor-phase growth apparatus in order to grow an epitaxial film onto the semiconductor wafer, there have been several conventional types of apparatus available; they may include (1) a vertical-type vapor-phase growth apparatus in which the susceptor being placed on a circular disc is heated from its bottom side, and (2) a single wafer type vapor-phase growth apparatus with which a good quality epitaxial film can be fabricated.

For example, inside the rectangular chamber being fabricated of quartz in said single wafer type vapor-phase growth apparatus, semiconductor wafer is mounted on the disc-shaped susceptor which is a graphite being coated with SiC. The semiconductor wafer is heated using a heater which is provided outside of the chamber in order to react with various types of reacting source gases passing through the chamber, resulting in growing the epitaxial film on the semiconductor wafer.

As seen in FIG. 3, said susceptor 5 is composed of a high purity graphite which is coated mainly by SiC. On the surface, a groove called as a wafer pocket 6 is formed in order to accomodate the silicon wafer. The size of said wafer pocket 6 is slightly larger than the dimension of the wafer 8 and the depth is about 1 mm. After placing the wafer 8 inside the wafer pocket 6, the susceptor is held in the reacting source gaseous flow at a predetermined temperature to generate the silicon epitaxial film layer 9 on the wafer surface.

Moreover, several improvements have been proposed in order to minimize the surface contact between the inner surface of the pocket and the wafer rear surface. These proposed improvements may include (1) a structure to contact-hold the wafer to a plurality of convex portions by forming a mesh-shaped shallow fine groove so-called a roulette, (2) making a tapered surface in order to confine the contact of the wafer at its outer periphery, or (3) using much coarser surface roughness of coated SiC surface than the surface roughness of the wafer.

As to a reacting source gas, a dopant source gas such as diborane (P type) or phosphine (N type) is added to a chloro-silane gas which is hydrogen diluted. Hence the silicon epitaxy as well as a bi-product of HCl are produced on the wafer surface through a heat CVD (chemical vapor deposition) reaction. As a result, although the silicon epitaxial growth on the wafer surface can proceed, the rear surface of said wafer is also exposed to diffusion reaction gas to create a Si—H—Cl atmosphere, which might furthermore lead to a precipitation/etching reaction in a microscopic scale.

For instance when the epitaxial growth having lower concentration than the dopant concentration of the wafer is conducted such as an epitaxial growth of P type film (specific resistance is 1 Ωcm) against the wafer with the dopant concentration P ++ type (specific resistance is 5 mΩcm), the dopant concentration in the epitaxial layer tends to increase at the outer peripheral portion of the wafer, as demonstrated in FIG. 4 which shows a change in dopant concentration from the center of the wafer and as a function of a distance from the center to the most outer periphery.

The above phenomenon might be due to the fact that the dopant species of the wafer 8 might be exhausted in Si—H—Cl atmosphere at the rear surface of wafer 8, and the exhausted dopant species might migrate to the front surface through the gaseous diffusion flow 11, resulting in increasing the dopant gaseous concentration locally. As a result, a particular region of the epitaxial layer where the dopant concentration is out of the range defined by the specification, leading to a poor production efficiency of the device.

SUMMARY OF THE INVENTION

Objective of the Invention

All of the forgoing have resulted in a requirement for improvement of the apparatus of the present invention in which it is an objective of the present invention to provide a susceptor which can prevent the increasing phenomenon of the dopant concentration in the epitaxial layer at its peripheral portion, as it would be obvious when the epitaxial growth proceeds at lower concentration than the dopant concentration of the wafer. It is, accordingly, another objective to provide a susceptor for the vapor-phase growth apparatus which can avoid the unwanted flow of the dopant species being exhausted at the rear side to the wafer surface.

Disclosure of the Invention

The present inventors found that, in a suscpetor for the vapor-phase growth apparatus, the aforementioned localized nonuniform distribution of the dopant concentration can be minimized by forming a vapor flow in order to prevent the unwanted flow of the dopant species being exhausted at the rear side to the wafer surface. After investigating various designs for the susceptor to achieve said objectives, the following design was evaluated to perform the best efficiency. By providing a through-hole passing through to the rear side at the outer peripheral portion of the wafer inside the wafer pocket, the down-flow from the upper surface of the susceptor is generated, so that the unwanted flow of the dopant species being exhausted toward the wafer surface can be prevented. As a result, the raise in the dopant concentration can be controlled at the outer peripheral portion of the epitaxial layer.

Namely, according to the present invention, a susceptor can be provided which is characterized by providing a through-hole passing through to the rear side at the most outer peripheral portion inside the wafer pocket which is a concave portion for mounting the wafer.

According to the present invention, the localized raise of the dopant concentration at the most outer peripheral portion of the grown epitaxial layer can be prevented by providing a through-hole passing through to the rear side of the susceptor at the outer periphery inside the wafer pocket which is used for mounting the wafer. Specifically, the raise in the dopant concentration in the epitaxial layer can be avoided when the epitaxial growth with a lower concentration than the dopant concentration of the wafer is progressing.

BRIEF DESCRIPTION OF THE DRAWINGS

The above and many other objectives, features and advantages of the present invention will be more fully understood from the ensuing detailed description of the preferred embodiment of the invention, which description should be read in conjunction with the accompanying drawings.

DETAILED DESCRIPTION OF PREFERRED EMBODIMENTS

Figure 1A:
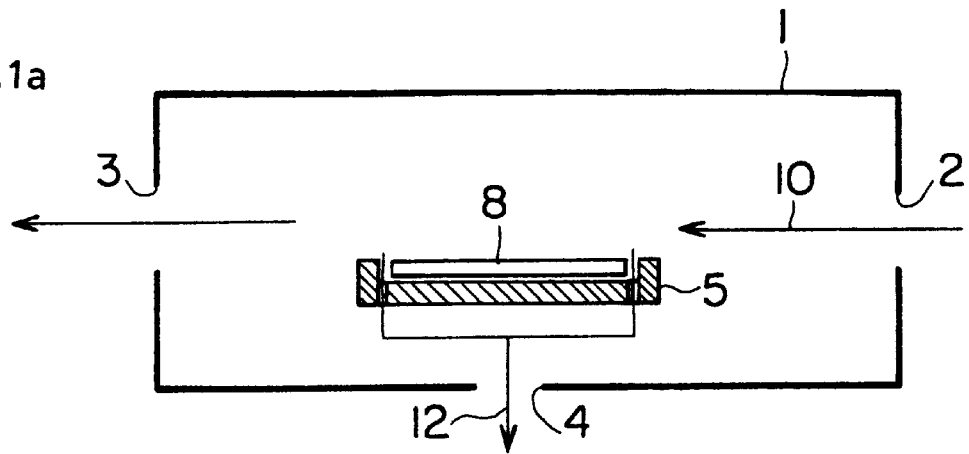
FIG. 1a is a view explaining a vapor-phase growth apparatus employing a susceptor, according to the present invention.

A vapor-phase growth apparatus seen in FIG. 1a has a rectangular chamber 1 made of quartz, in which the semiconductor wafer 8 is mounted on the circular disc-shaped susceptor 5 which is a graphite substrate being coated with SiC. The semiconductor wafer 8 is heated by a heater (not shown) which is placed outside of the chamber 1 to react with the reacting source gas flowing horizontally inside the chamber 1 in order to generate the epitaxial film 9 on the semiconductor wafer surface 8.

The susceptor 5 of the present invention has an arc-shaped groove-type through-hole portion 7 at the most outer peripheral portion inside the wafer pocket 6 for mounting the semiconductor wafer 8. The inner plain portion of the wafer pocket is a coated SiC layer.

In FIG. 1a, although the reacting source gas 10 is introduced horizontally from the gas inlet opening 2 of the chamber 1 to the gas exhaust opening 3, the source gas is supplied and heated particularly to the wafer surface 8 and the bi-product gas is generated during the epitaxial reaction, so that the gas can be subjected to the volumetric expansion. By providing a through-hole portion 7 at the outer peripheral portion inside the wafer pocket of the susceptor 5, a localized gas flow is generated from the wafer surface 8, and the boron species being exhausted from the rear surface of the wafer 8 can be exhausted without the unwanted flow-back to the front surface of the wafer 8.

Furthermore, by blowing the source gas directly toward the front surface of the wafer 8, the gas flow 12 passing from the front surface to the rear surface of the wafer 8 through the through-hole can be promoted, so that the growth efficiency can be enhanced. Moreover, by providing an exhaust opening 4 at the rear side of the susceptor 5 in the chamber 1, the gas flow passing from the front surface to the rear surface of the wafer 8 through the through-hole portion 7 can also be promoted, resulting in that the epitaxial growth efficiency can be improved.

In the above, although the single wafer type vapor-phase growth apparatus has been described, the type of the apparatus to which the present invention is applicable includes any prior art types including a vertical-type vapor-phase growth apparatus or a barrel-type vapor-phase growth apparatus. With any one of these types of growth apparatus, according to the present invention, the reacting source gas can flow in parallel to the wafer surface being placed in the susceptor.

The through-hole portion of the susceptor in this invention can be various types including an arc-shaped groove-type through-hole portion as mentioned previously, an ovalshaped through-hole portion, or a plurality of small size of holes. Moreover, with the single wafer type of vapor-phase growth apparatus supporting wafers at the central portion of the susceptor, if through-holes as many as possible can be provided, the exhausting efficiency of the boron species from the rear surface of the wafer could be enhanced in such a way that said many through-holes are designed and fabricated with relatively large connecting area left, so that the area can be strong enough to withstand the weight of the outer peripheral portion area by the wafer pocket. Similarly, with any other susceptor types than the single wafer type, it is recommended to provide through-holes as many as possible if there is an enough connecting portion left to withstand the structural strength under considering the wafer weight. Furthermore, it is preferable to define the diameter (or width) of the through-hole along the wafer direction to be, at most, equal to the wafer's outer periphery under taking the heating effect into account.

EMBODIMENTS

Figure 1B:
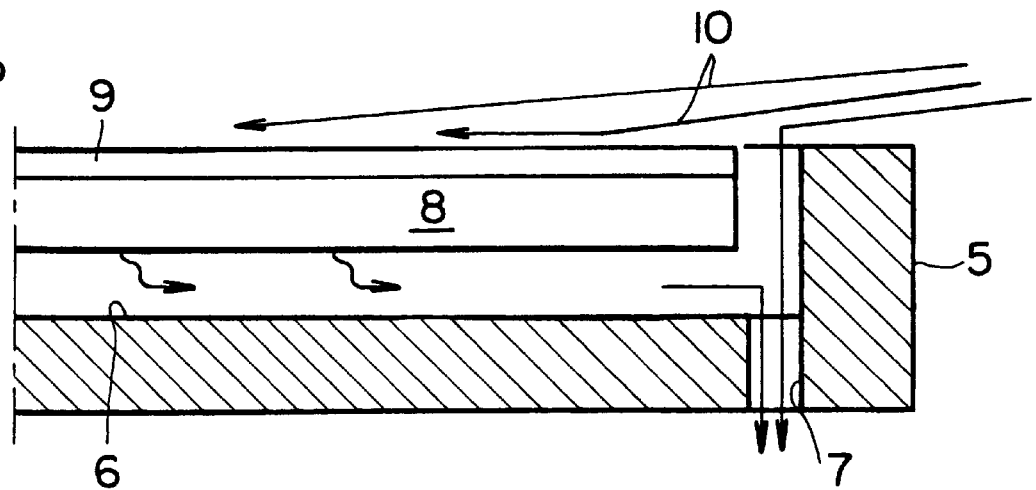
FIG. 1b is another view describing the cross-sectional view of the susceptor along its radius direction.
Figure 3:
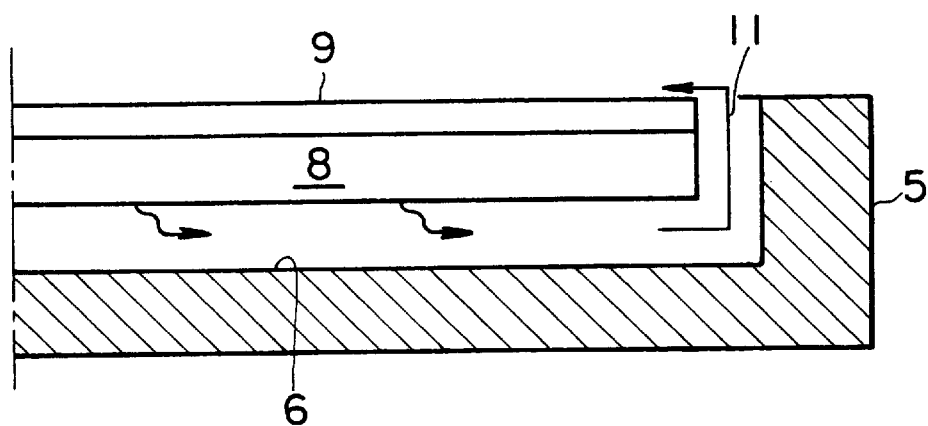
FIG. 3 shows a cross-sectional view of the conventional type of susceptor along its radius direction.

Using the horizontal single wafer type vapor-phase growth apparatus with a lamp-heating method as seen in FIG. 1, an epitaxial film with the film thickness of about 10 pm was formed at a reaction temperature of 1,150° C. onto the P++ type (100) plane silicon semiconductor base plate (with 200 mm diameter) having the specific resistance of 5 mΩcm using $SiHCl_3$ diluted with hydrogen as the silicon supplying source gas. Two tests were conducted; one was with susceptor having the through-hole of the present invention and the other was with the conventional type of susceptor without any through-holes as seen in FIG. 3.

Figure 2A:
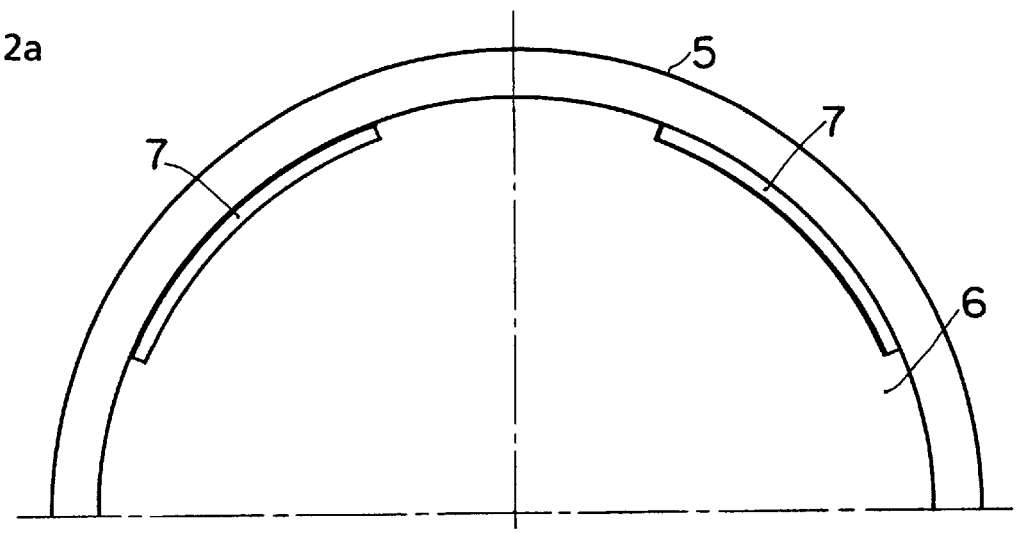
FIGS. 2a and 2b are upper half views of the susceptor, according to the present invention.
Figure 2B:
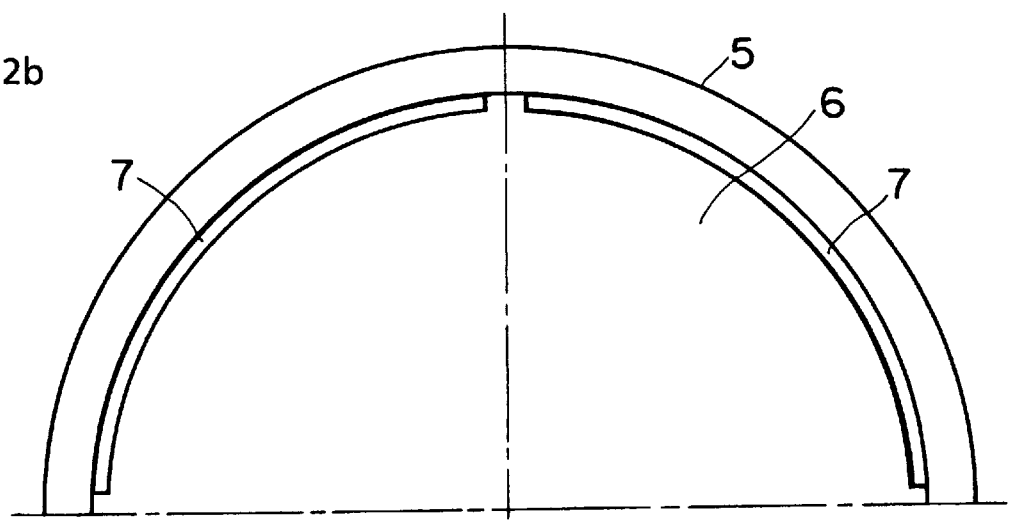

As seen in FIGS. 2a and 2b, the suscpetor according to the present invention has an arcshaped groove-type through-hole portion 7 at the most outer peripheral portion of the wafer pocket 6. In FIG. 2a, four locations are installed with the through-hole portions 7 leaving the connecting area of 75 mm on its peripheral portion. On the other hand, in FIG. 2b, four locations are provided with through-hole portions 7 leaving 5 mm connecting area on its peripheral portion. The length fractions of said each through-hole portion per the total peripheral length was approximately 50% and 90%, respectively.

Figure 4:
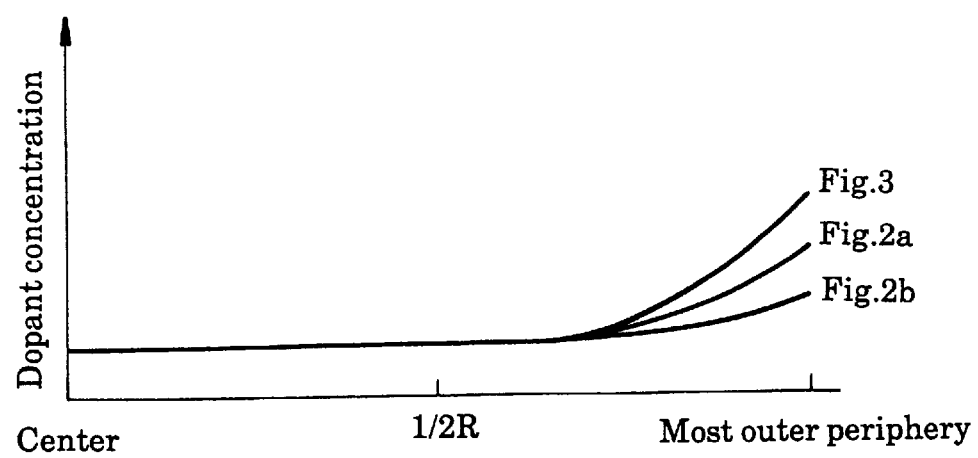
FIG. 4 shows changes in a dopant concentration as a function of a distance from the center of the wafer along its radius direction.

The raise in the dopant concentration of the outer peripheral portion of the grown epitaxial film was listed in Table 1 and presented in FIG. 4. By comparing with the conventional type as seen in FIG. 3, it was found that the longer the through-hole portion in both FIG. 2a and FIG. 2b, the lesser the dopant concentration increase. Table I. Comparison of dopant concentration at center and 3 mm from the edge for conventional type susceptor and the susceptor of the present invention.

TABLE I

| susceptor | center location ($\times 10^{16}$ atoms/ $cm^3$) | 3 mm from the edge ($\times 10^{16}$ atoms/ $cm^3$) | increment ($\times 10^{15}$ atoms/ $cm^3$) |
|---|---|---|---|
| conventional type (FIG. 3) | 1.00 | 1.20 | 2.0 |
| Example 1 (FIG. 2a) | 1.00 | 1.10 | 1.0 |
| Example 2 (FIG. 2b) | 1.00 | 1.05 | 0.5 |

While the invention has been explained with reference to the structure disclosed herein, it is not confined to the details as set forth, and this application is intended to cover modifications and changes as may come within the scope of the following claims.

What is claimed is:

1. A susceptor for a vapor-phase growth apparatus comprising at least one through hole passing through a rear side at an outer peripheral portion of a wafer pocket which is formed as a concave shape in order to mount said wafer.

2. The susceptor of claim 1, wherein the at least one through hole is shaped as a groove and a plurality thereof is provided on a periphery.

* * * * *